United States Patent
Jung

(10) Patent No.: US 7,251,193 B2
(45) Date of Patent: Jul. 31, 2007

(54) PSEUDO-DUAL PORT MEMORY WHERE RATIO OF FIRST TO SECOND MEMORY ACCESS IS CLOCK DUTY CYCLE INDEPENDENT

(75) Inventor: Chang Ho Jung, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 11/282,333

(22) Filed: Nov. 17, 2005

(65) Prior Publication Data

US 2007/0109909 A1 May 17, 2007

(51) Int. Cl.
*G11C 8/00* (2006.01)
(52) U.S. Cl. ............... 365/233.5; 365/233; 365/194
(58) Field of Classification Search ............ 365/233.5, 365/233, 194
See application file for complete search history.

(56) References Cited

U.S. PATENT DOCUMENTS 5,768,213 A * 6/1998 Jung et al. ................. 365/233
6,882,562 B2 * 4/2005 Beucler ..................... 365/233

* cited by examiner

*Primary Examiner*—David Lam
(74) *Attorney, Agent, or Firm*—Nicholas J. Pauley; Thomas Rouse; John L. Ciccozzi

(57) ABSTRACT

A pseudo-dual port memory performs both a first memory access operation and a second memory access operation in a single period of an externally supplied clock signal CLK. The signal CLK is used to latch a first address for the first operation and a second address for the second operation. Control circuitry generates first control signals that initiate the first operation. The time duration of the first operation depends upon a delay through a delay circuit. A precharge period follows termination of the first operation. The time duration of the precharge period depends upon a propagation delay through the control circuit. The memory access of the second operation is initiated following termination of the precharging. The time duration of the second memory access depends on a delay through the delay circuit. The time when the second operation is initiated is independent of the duty cycle of CLK.

22 Claims, 8 Drawing Sheets

CELL ARRAY

COLUMN MULTIPLEXERS / DEMULTIPLEXERS

ADDRESS INPUT LATCH AND
READ/WRITE MULTIPLEXER

DATA INPUT LATCH AND DIN
DATA CONTROL

PSEUDO-DUAL PORT MEMORY WHERE RATIO OF FIRST TO SECOND MEMORY ACCESS IS CLOCK DUTY CYCLE INDEPENDENT

BACKGROUND

1. Field

The disclosed embodiments relate generally to pseudo-dual port memories.

2. Background

Dual port memories typically have two ports and an array of memory cells. The memory array can be simultaneously accessed from both of the ports provided that the memory cells being accessed from one port are not the same memory cells that are being accessed from the other port. A common type of memory cell used in such dual port memories involves eight field effect transistors (FETs). Four of the transistors are interconnected to form two cross-coupled inverters. A first data node D of the memory cell is the node at the output lead of a first of the inverters and the input lead of the second of the inverters. A second data node DN of the memory cell is the node at the output lead of the second of the inverters and the input lead of the first of the inverters. There are two access transistors coupled to the first data node D. The first access transistor is provided so that a first bit line B1 can selectively be coupled to the first data node D. The second access transistor is provided so that a second bit line B2 can selectively be coupled to the first data node D. Similarly, there are two access transistors coupled to the second data node DN. The first access transistor is provided so that a first bit line bar B1N can be coupled to the second node DN. The second access transistor is provided so that a second bit line bar B2N can be coupled to the second node DN. The first bit line B1 and first bit line bar B1N constitute a bit line pair and a for coupling an addressed memory cell to a first of the two ports of the dual port memory. The second bit line B2 and second bit line bar B2N constitute a bit line pair and are for coupling an addressed memory cell to a second of the two ports of the dual port memory.

The memory cells in a single port memory typically only include six transistors. As in the case of the eight-transistor cell, four of the transistors form a cross-coupled inverter structure. Rather than there being two pairs of access transistors as in the eight transistor cell, however, the six transistor cell has only one pair of access transistors. A first access transistor is provided for selectively coupling the first data node D of the cross-coupled inverters to a bit line B. A second access transistor is provided for coupling a second data node DN of the cross-coupled inverters to a bit line bar BN. The six-transistor memory cell typically consumes only about half as much integrated circuit area than the eight-transistor cell when the two types of memory cells are fabricated using the same process.

In order to take advantage of the smaller size of the six-transistor memory cell, a memory device called a pseudo-dual port memory is often used. In one example, a pseudo-dual port memory has a single memory array where each memory cell of the array is a six-transistor memory cell that can be selectively coupled to a single pair of bit lines (for example, bit line B and bit line bar BN). The memory array operates as a single port memory in that only one memory access is performed at one time.

The pseudo-dual port memory, however, mimics a dual port memory in that it has two ports. Within a single cycle of a clock signal supplied to the pseudo dual port memory, it appears that a first access of the memory array is performed from one port and that a second access of the memory array is performed from the other port. In reality, though, two accesses of the memory array are performed in rapid succession. If, for example, a read operation is to be performed from the first port of the pseudo-dual port memory and a write operation is to be performed from the second port of the pseudo-dual port memory, then data from addressed memory cells are output onto the data terminals of the first port at a first time where the address of the addressed memory cells is provided on address terminals of the first port. After the read operation, then a write operation is performed where data on the data terminals of the second port is written into addressed memory cells where the address of the addressed memory cells is provided on the address terminals of the second port. The two accesses occur in rapid succession such that from outside the pseudo-dual port memory, the pseudo-dual port memory appears to allow two accesses of the memory array at the same time (i.e., during a single cycle of the externally supplied clock signal).

Within the pseudo-dual port memory, a structure sometimes known as a Time Delayed Multiplexer (TDM) works to control the two accesses of the single memory array. The TDM uses the rising edge of the clock signal to initiate the first memory access. The TDM uses the falling edge of the clock signal to initiate the second memory access.

Where there are two memory accesses to be performed on a single memory array in a pseudo-dual port memory, the inventor has recognized that the amount of time required to perform the first access may sometimes not be equal to the amount of time required to perform the second access. For example, in some memory array configurations, the amount of time required to perform a first memory read operation is smaller than the amount of time required to perform a second memory write operation. Using a conventional TDM approach slows overall memory access times because the relative amounts of time available for the two operations is determined by the time when the rising edge of the clock cycle occurs and the time when the falling edge of the clock cycle occurs. If, for example, the clock signal is low for as long as it is high in a clock cycle (i.e., the clock signal has a 50/50 duty cycle), then the same amount of time must be allowed for performing both the faster read operation and the slower write operation. The result is an amount of wasted time that starts after the read operation has been completed and ends upon the falling edge of the clock signal.

Not only does the conventional TDM approach sometimes slow overall memory access times in situations where the relative amounts of time required to perform the two memory access does not match the duty cycle of the clock signal, but the conventional TDM approach also can cause overall memory access times to be slower than they otherwise would have to be due to the use of the falling edge of the clock signal to initiate operations. There may be jitter in the duty cycle of the clock signal such that the timing of the falling edge of the clock signal changes from clock cycle to clock cycle. If the circuitry is optimized for operation under one clock signal duty cycle condition, then it typically is not optimized for operation under another clock signal duty cycle condition. A time margin is typically built into the circuitry so that the circuitry of the pseudo-dual port memory will operate correctly under all clock signal duty cycle conditions. This time margin translates into wasted time under certain operating conditions where the time margin is not required for proper operation. The maximum clock frequency of the pseudo-dual port memory is therefore specified to be lower than it could be were there no such time margin.

An improved pseudo-dual port memory is desired.

SUMMARY INFORMATION

A pseudo-dual port memory performs both a first memory access operation and a second memory access operation during a single period of an externally supplied clock signal CLK. The pseudo-dual port memory includes an array of memory cells and control circuitry. The control circuitry includes a delay circuit and an amount of digital logic.

In response to a first edge of the signal CLK, the control circuitry generates first control signals. The first control signals initiate the first memory access operation. In one example, the first memory access is a read. After a first amount of time A, the delay circuit generates a first reset signal. The first reset signal is used to terminate the first memory access operation.

The control circuitry automatically generates second control signals that cause the second memory access operation to be performed. A precharging of bit lines of the memory array occurs first in the second memory access operation. A second amount of time between the end of the first memory access operation and the end of the precharging depends upon a signal propagation delay time B through the amount of of digital logic.

When the precharging stops, the second control signals initiate the second memory access of the second memory access operation. In one example, the second memory access is a write. After a third amount of time C, the delay circuit generates a second reset signal. The second reset signal is used to terminate the second memory access and therefore also terminates the second memory access operation.

The time when the first memory access operation is terminated and the time when the second memory access operation is initiated do not depend on the time when the falling edge of the clock signal CLK occurs. The time duration of the first memory access operation does not depend on the duty cycle of the signal CLK but rather depends on unclocked delays through the control circuitry. In the design of a pseudo-dual port memory, the amount of time allotted to the first memory access operation can be increased or decreased by increasing or decreasing the delay time A introduced by the delay circuit.

The precharging period automatically follows the termination of the first memory access operation. The duration of the precharging period also does not depend on the duty cycle of the signal CLK but rather depends on unclocked delays through the control circuitry. In the design of a particular pseudo-dual port memory, the amount of time allotted to precharging in preparation for the second memory access can be increased or decreased by increasing or decreasing the propagation delay time B. Noninverting logic can be added or removed from the propagation path to increase or decrease delay time B.

The time duration of the second memory access also does not depend on the duty cycle of the signal CLK but rather depends on unclocked delays through the control circuitry. In the design of a particular pseudo-dual port memory, the amount of time allotted to the second memory access can be increased or decreased by increasing or decreasing the delay time C introduced by the delay circuit. In one embodiment, delay times A and C are identical because the same delay circuit generates both delay times A and C.

Problems associated with initiating the second memory access operation using the falling edge of an external clock signal where the falling edge has an undesirably large amount of jitter are avoided because the falling edge of an externally supplied clock signal is not used to terminate the first read operation or to initiate the second write operation. The ratio of time allotted for the first memory access operation to time allotted for the second memory access operation is independent of the duty cycle of the externally supplied clock signal CLK. Delay times A, B and C can be adjusted such that the ratio is smaller than the duty cycle of the signal CLK. Alternatively, delay times A, B and C can be adjusted such that the ratio is larger than the duty cycle of the signal CLK. The control circuit design is therefore versatile in that the times allotted for the first and second memory accesses can be easily adjusted in the design phase of a memory to accommodate different memory cell arrays having different sizes and/or characteristics.

Additional hardware embodiments and additional methods are described in the detailed description below. This summary does not purport to define the invention.

The invention is defined by the claims.

DETAILED DESCRIPTION

Figure 1:
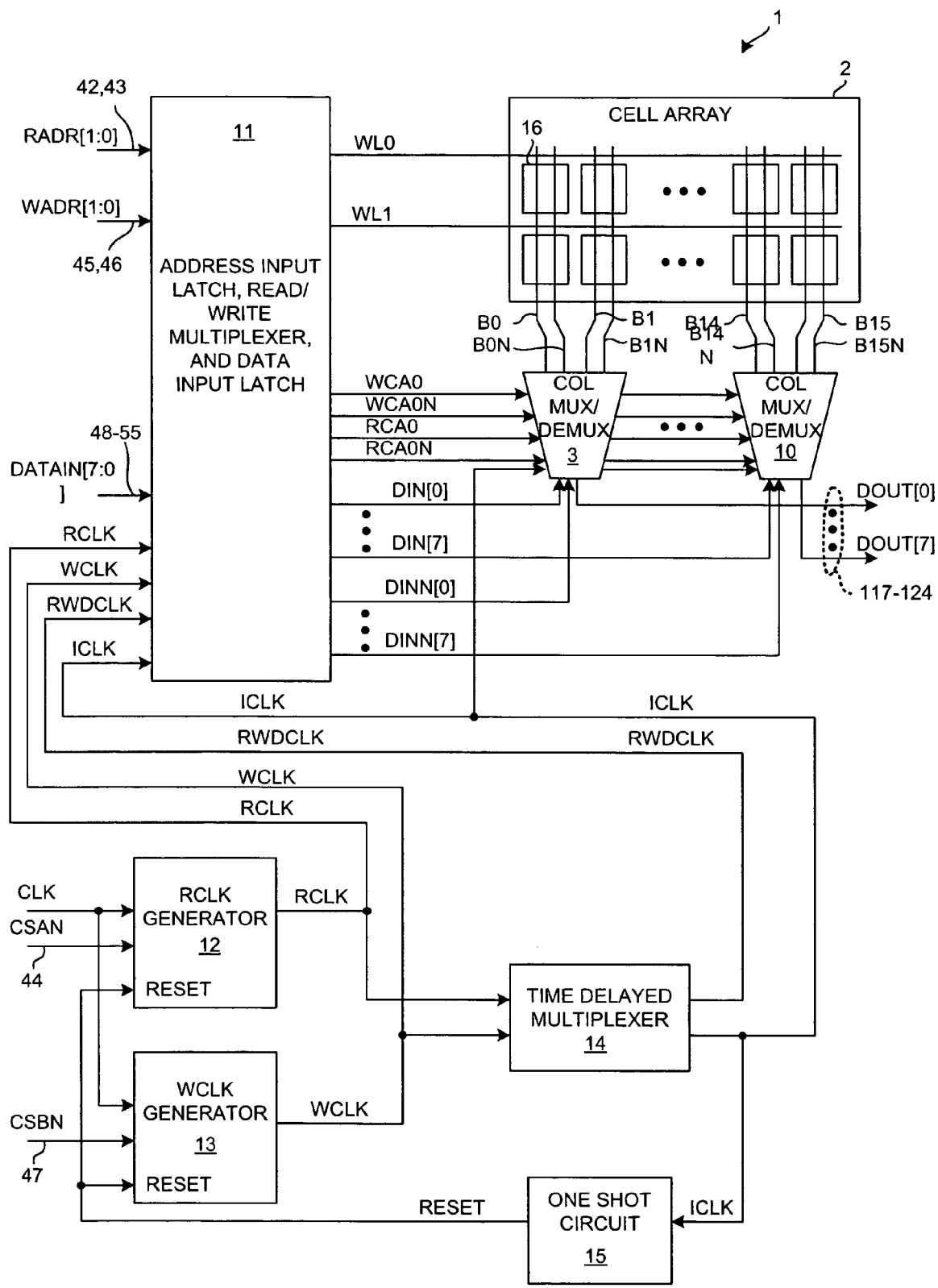
FIG. 1 is a high-level block diagram of a pseudo-dual port memory device 1 in accordance with one embodiment.

FIG. 1 is a high-level block diagram of a pseudo-dual port memory device 1 in accordance with one embodiment. Memory device 1 includes an array 2 of static random access memory cells. In the illustrated example, array 2 includes two rows of memory cells, where each row includes sixteen memory cells. In addition to array 2, memory device 1 includes a set of eight column multiplexer/demultiplexers 3-10. Only the first and eighth column multiplexer/demultiplexers 3 and 10 are illustrated. Memory device 1 also includes an address input latch, read/write multiplexer, and data input latch circuit 11, a read clock generator circuit 12, a write clock generator circuit 13, a time delayed multiplexer circuit 14, and a one shot circuit 15. The circuitry in blocks 3-15 is control circuitry that controls access to array 2.

Figure 2:
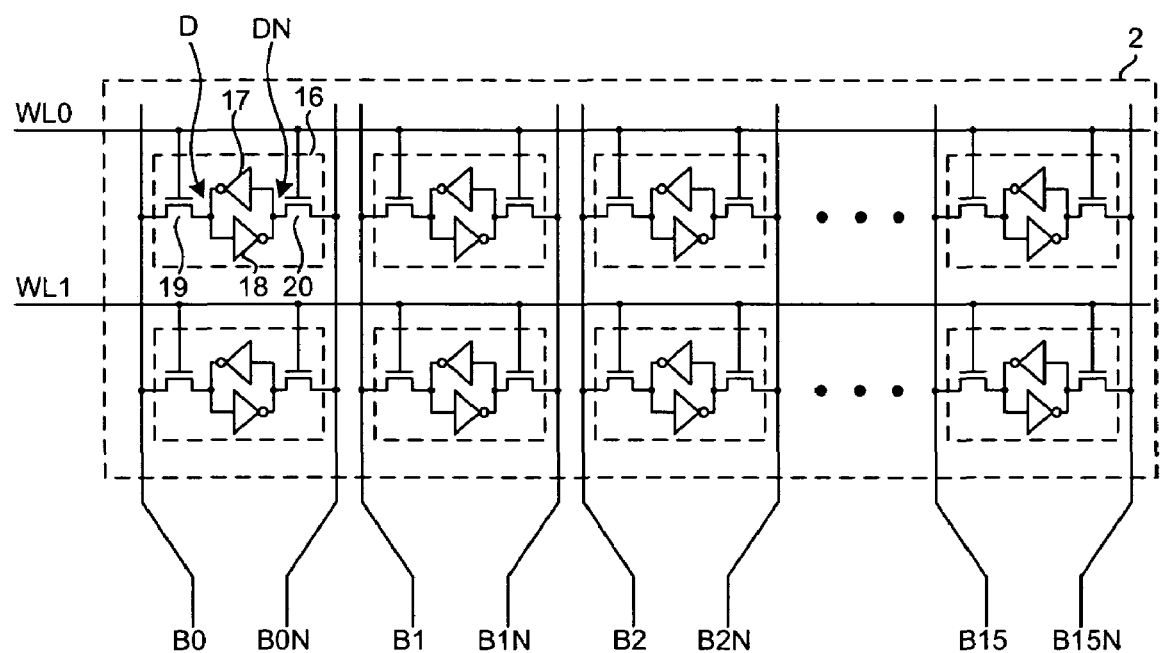
FIG. 2 is a more detailed diagram of memory array 2 of FIG. 1.

FIG. 2 is a more detailed diagram of memory array 2. Each of the memory cells is a six-transistor memory cell. Reference numeral 16 identifies the memory cell in the upper left hand corner of the array. Four of the transistors of memory cell 16 are interconnected to form a pair of cross-coupled inverters 17 and 18. A first data node D of memory cell 16 is coupled to the output lead of inverter 17 and is coupled to the input lead of inverter 18. A second data node DN of memory cell 16 is coupled to the output lead of inverter 18 and is coupled to the input lead of inverter 17. A first access transistor 19 is provided so that data node D can be selectively coupled to a vertically extending bit line B0. A second access transistor 20 is provided so that data node DN can be selectively coupled to a vertically extending bit line B0N. As illustrated, pairs of bit lines B0 and B0N, B1 and B1N . . . B15 and B15N extend through the array in the vertical dimension. For example, the pair of bit lines B0 and B0N extends vertically up through the leftmost column of memory cells. The "N" suffix in this notation indicates "not", or the complement of the signal having the same signal name without the "N" suffix. A pair of word lines WL0 and WL1 extends through the array in the horizontal dimension. Word line WL0 is coupled to the gates of the access transistors of the various memory cells of the upper row of memory cells of the array. Word line WL1 is coupled to the gates of the access transistors of the various memory cells of the lower row of memory cells of the array.

Figure 3:
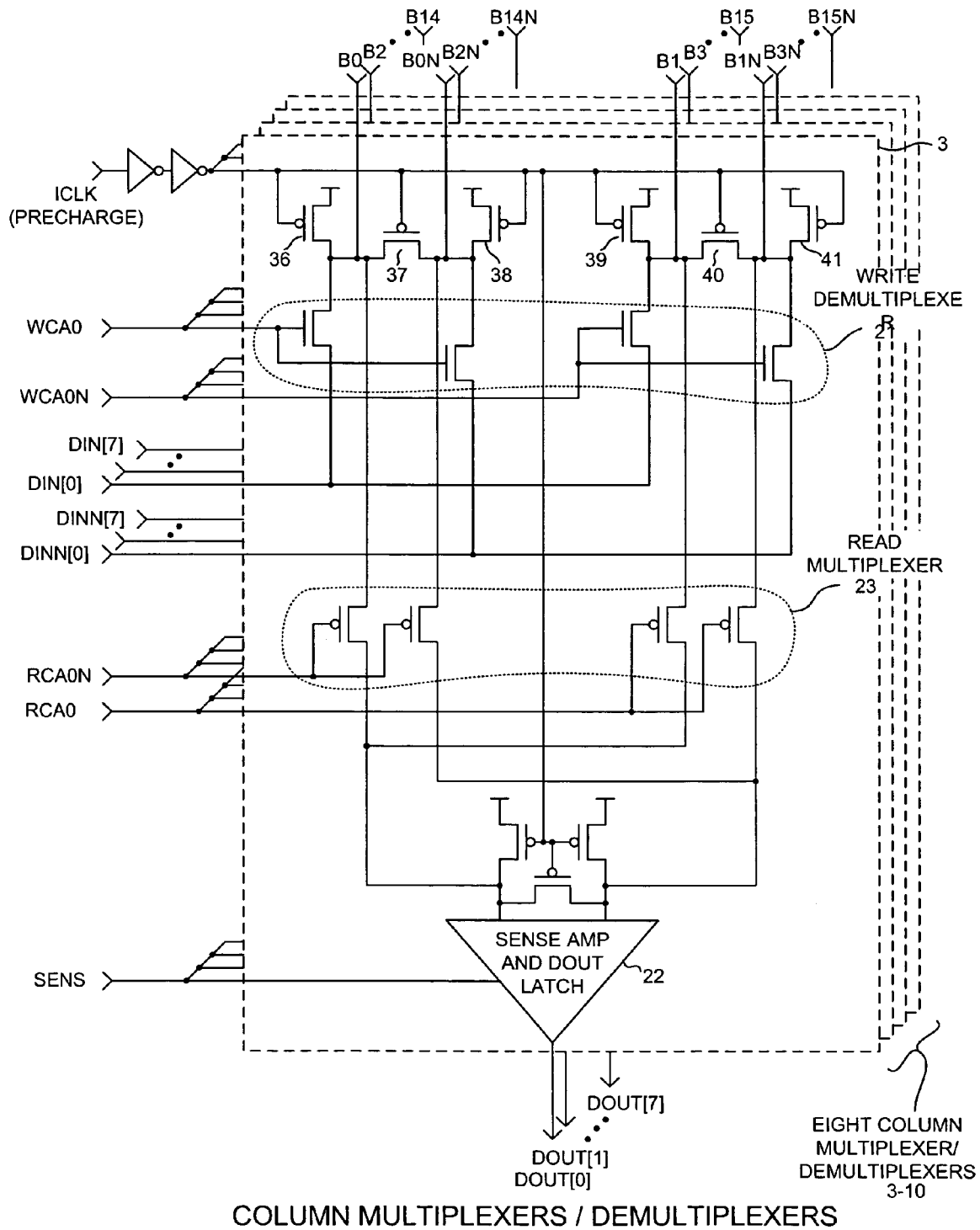
FIG. 3 is a more detailed diagram of the eight column multiplexer/demultiplexers 3-10 of FIG. 1.

FIG. 3 is a more detailed diagram of the eight column multiplexer/demultiplexers 3-10 of FIG. 1. Each column multiplexer/demultiplexer has two pairs of bit line leads. Column multiplexer/demultiplexer 3, for example, has leads that are coupled to a first pair of bit lines B0 and B0N and also has leads that are coupled to a second pair of bit lines B1 and B1N. The two pairs of bit lines are illustrated extending down from the top into the column multiplexer/demultiplexer 3 in FIG. 3.

Each column multiplexer/demultiplexer receives a read column address RCA0 and its complement RCA0N. During a read operation, one of the two pairs of bit lines is multiplexed by multiplexer 23 onto a differential pair of input leads of a sense amplifier 22. The values RCA0 and RCA0N determine which one of the two pairs of bit lines is multiplexed by multiplexer 23 onto the differential pair of input leads. Sense amplifier 22 includes a latch that latches the value being output onto the data output lead of the column multiplexer/demultiplexer. The latch is transparent when an input signal SENS is low and the latch latches on a low-to-high transition of the signal SENS. The data output leads DOUT[0:7] of memory device 1 are the data output leads of the eight column multiplexers/demultiplexers 3-10, respectively.

Each column multiplexer/demultiplexer also receives an internal clock signal ICLK. The signal ICLK is a precharge signal that causes the bit lines to be precharged when ICLK is low. The ICLK signal is described in further detail below.

Each column multiplexer/demultiplexer also receives a write column address WCA0 and its complement WCA0N. Each column multiplexer/demultiplexer also receives a latched data input value and its complement. The first column multiplexer/demultiplexer 3, for example, receives latched input data value DIN[0] and its complement DINN[0]. During a write operation, the input data values DIN[0] and DINN[0] are demultiplexed by demultiplexer 21 onto one of the two pairs of bit lines that are coupled to the column multiplexer/demultiplexer 3. The particular pair of bit lines is determined by the write column address WCA0 and its complement WCA0N. Accordingly, during a read operation data passes from a selected pair of the bit lines, through multiplexer 23, through the sense amplifier 22, and onto the data output lead DOUT[0] of the column multiplexer/demultiplexer 3. During a write operation, data passes from the data input leads DIN[0] and DINN[0], through demultiplexer 21, and onto a selected pair of the bit lines b0 and B0N or B1 and B1N.

Figure 4:
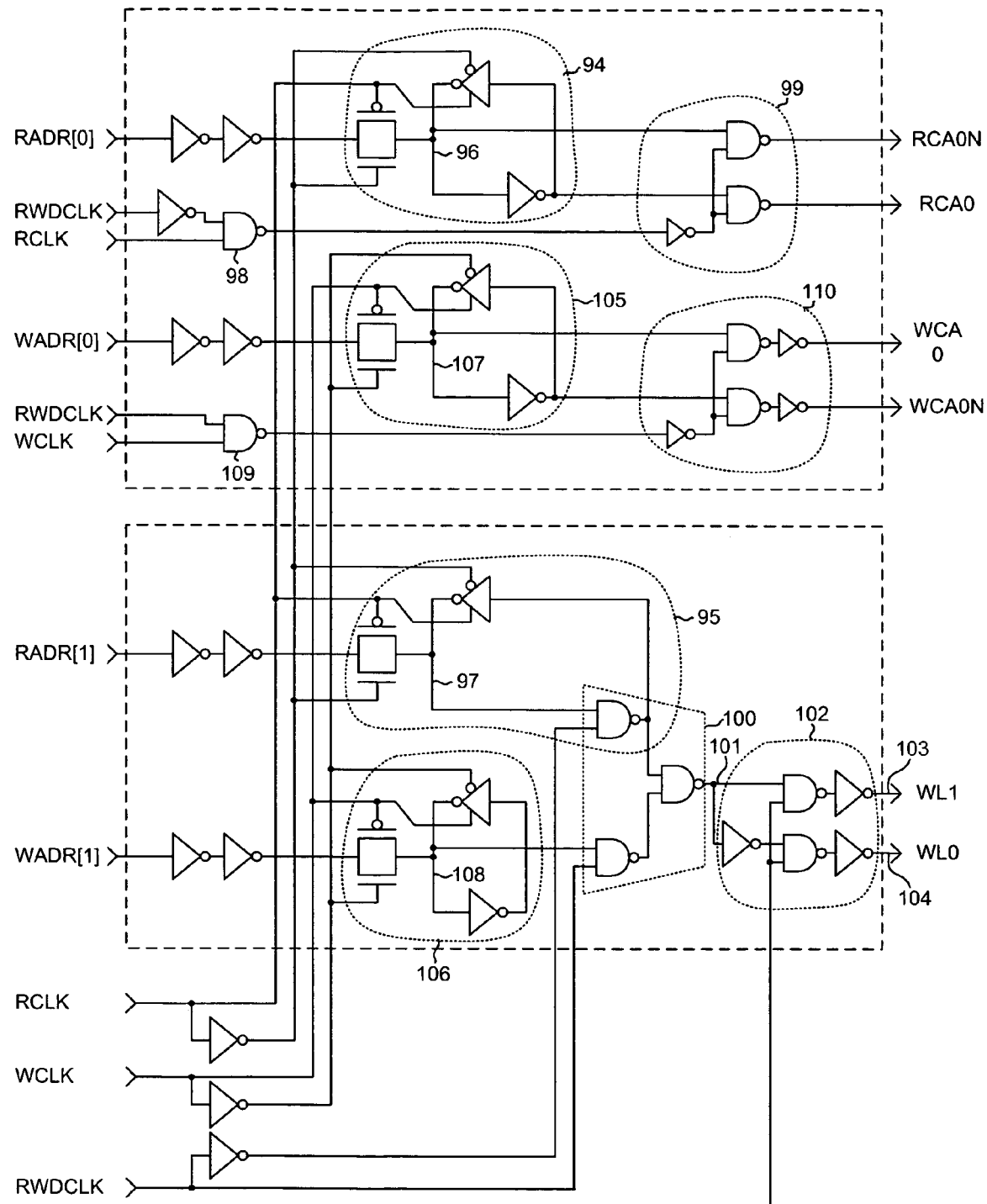
FIG. 4 is a more detailed diagram of the address input latch and read/write multiplexer portion of block 11 of FIG. 1.

FIG. 4 is a more detailed diagram of the address input latch and read/write multiplexer portion of block 11 of FIG. 1. The circuit of FIG. 4 latches an incoming two-bit read address RADR[1:0] and also latches an incoming two-bit write address WADR[1:0]. The circuit of FIG. 4 outputs word line values WL1 and WL0, read column address values RCA0 and RCA0N, and write column address values WCA0 and WCA0N.

Figure 5:
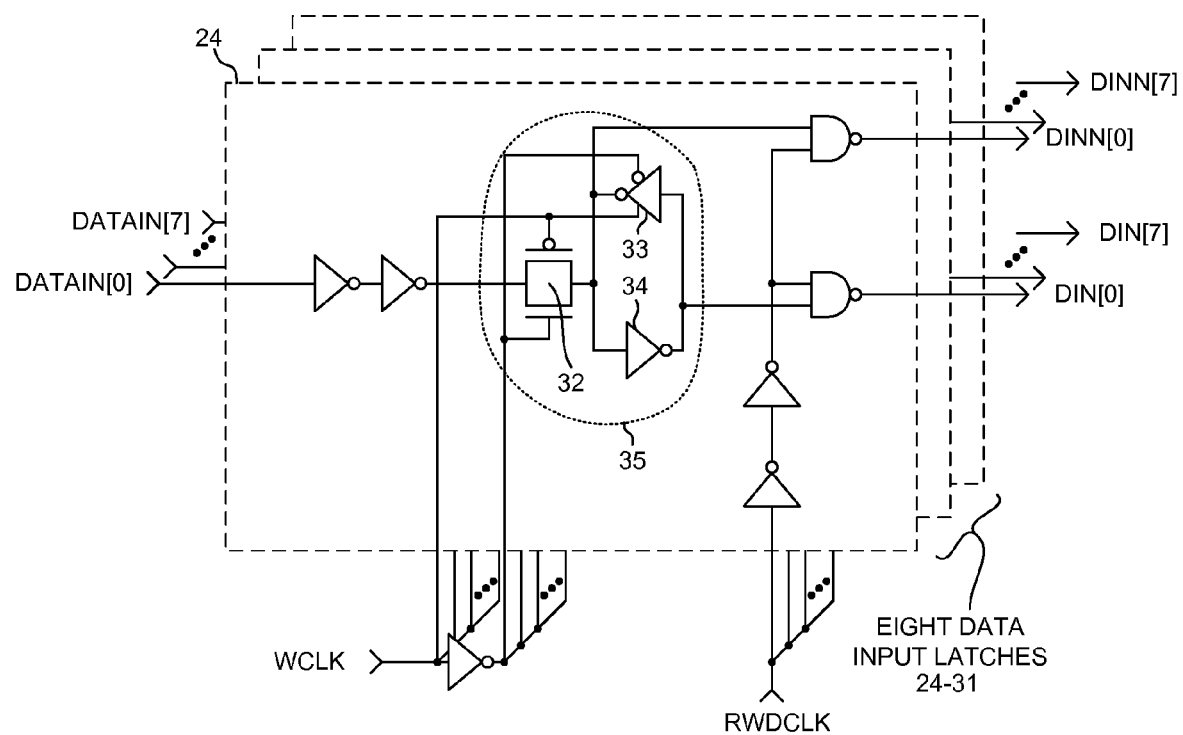
FIG. 5 is a more detailed diagram of the data input latch portion of block 11 of FIG. 1.

FIG. 5 is a more detailed diagram of the data input latch portion of block 11 of FIG. 1. As illustrated, there are eight identical data input latches 24-31 that are organized in parallel so that they latch an eight-bit input data value DATAIN[7:0] and output an eight-bit latched data value DIN[7:0] and its complement DINN[7:0]. A write clock signal WCLK is used to latch the incoming input data value DATAIN[7:0] into the eight data input latches. Each data input latch is transparent when the write clock signal WCLK is low, and latches when the write clock signal WCLK transitions low-to-high. In data input latch 24, the transistors making up the pass gate 32 and the cross-coupled inverters 33 and 34 together form a transparent latch 35. The digital value stored in the data input latch as well as the complement of the digital value stored are supplied onto the data leads DIN[0] and DINN[0] of the data input latch when the read/write decoding clock signal RWDCLK is asserted high. If, on the other hand, the signal RWDCLK is low, then both the signals on both the DIN[0] and DINN[0] output leads are forced high.

Figure 6:
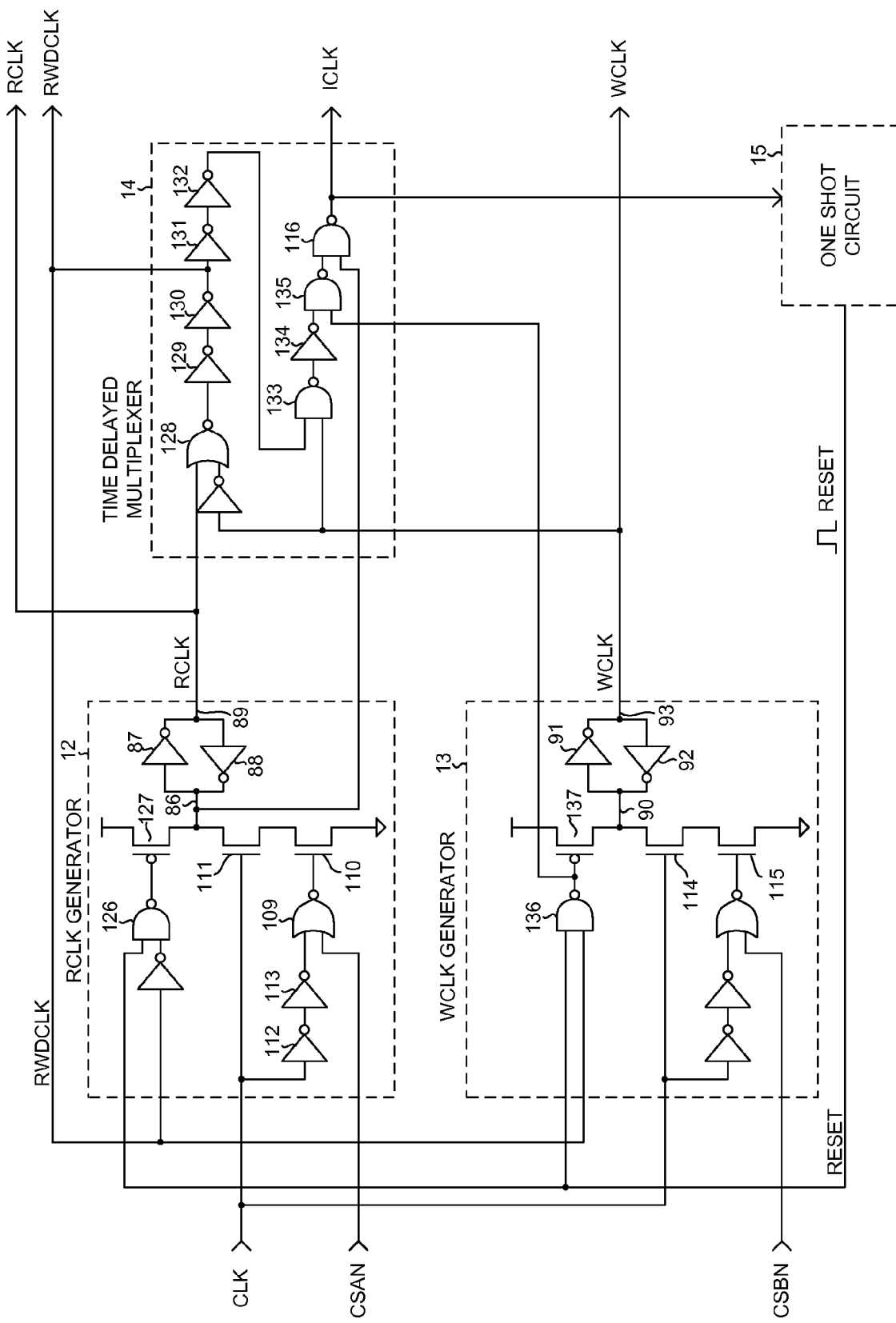
FIG. 6 is a more detailed diagram of the read clock generator circuit 12, the write clock generator circuit 13, the time delayed multiplexer circuit 14 and the one shot circuit 15 of FIG. 1.

FIG. 6 is a more detailed diagram of the read clock generator circuit 12, the write clock generator circuit 13, the time delayed multiplexer circuit 14 and the one shot circuit 15 of FIG. 1. Pseudo-dual port memory 1 is a synchronous memory that operates synchronously with respect to the externally supplied clock signal CLK. When the externally supplied clock signal CLK transitions high, the read clock generator circuit 12 latches an externally supplied read select signal CSAN. CSAN is an active low signal. When the externally supplied clock signal CLK transitions high, the write clock generator circuit 13 latches an externally supplied write select signal CSBN. CSBN is an active low signal. Time delayed multiplexer circuit 14 is not clocked by the external clock signal CLK and includes no sequential logic elements (i.e., no flip flops and no latches). The circuitry of FIG. 6 outputs a read clock signal RCLK, a write clock signal WCLK, the internal clock signal ICLK, and the read/write decoding clock signal RWDCLK.

Operation of pseudo-dual port memory device 1 is described below in connection with the waveform diagram of FIG. 7. Signals names preceded with an asterisk in FIG. 7 are externally supplied input signals that are supplied to the pseudo-dual port memory device 1.

Figure 7:
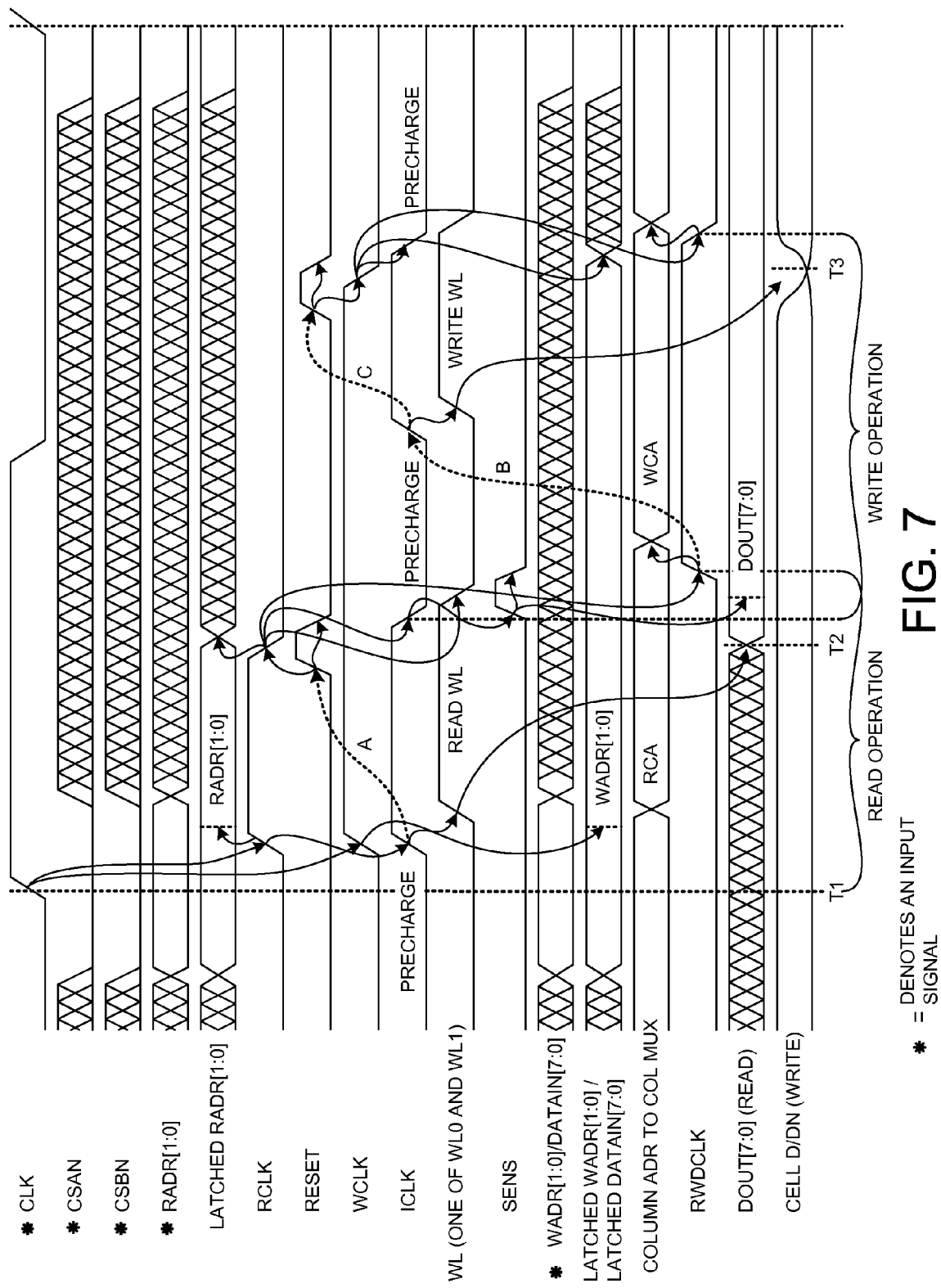
FIG. 7 is a waveform diagram that illustrates an operation of the pseudo-dual port memory device 1 of FIGS. 1-6.

Initially, the internal clock signal ICLK is low as illustrated in FIG. 7. ICLK is supplied to the column multiplexer/demultiplexers 3-10 as illustrated in FIG. 3. When ICLK is low, the P-channel transistors 36-38 and 39-41 in each of the column multiplexer/demultiplexers are conductive. All the pairs of bit lines are therefore precharged to supply voltage VCC. This precharging of the bit lines is an initial condition.

Because both a read and a write operation are to be performed in a single cycle of clock signal CLK, a two-bit read address RADR[1:0] is placed on the two read address input leads 42 and 43 of pseudo-dual port memory 1, the read select signal CSAN is asserted on input lead 44 of pseudo-dual port memory 1, a two-bit write address WADR[1:0] is placed on the two write address input leads 45 and 46 of pseudo-dual port memory 1, and the write select signal CSBN is asserted on input lead 47 of pseudo-dual port memory 1. An eight-bit data value DATAIN[7:0] that is to be written during a write operation is supplied onto the eight data input leads 48-55 of the pseudo-dual port memory 1.

The read address input leads 42 and 43 and the data output leads 117-124 are a first port (a read only port) of the pseudo-dual port memory device 1. The write address input leads 45 and 46 and the data input leads 48-55 are a second port (a write only port) of the pseudo-dual port memory device 1.

When the clock signal CLK transitions high, the value of the read select signal CSAN is latched into the latch of the read clock generator circuit 12 of FIG. 6. If CSAN is low, then the voltage on latch node 86 is pulled to ground and is latched by cross-coupled inverters 87-88. If CSAN is high, then the voltage on node 86 would have remained in its previously latched state. As the waveform diagram of FIG. 7 shows, CSAN is low in the presently described operational example. A digital low is therefore latched into node 86. A digital high is therefore latched into node 89. The digital value on node 89 is the value of the read clock signal RCLK. The read clock signal RCLK therefore transitions high as illustrated in FIG. 7.

In a similar fashion, the write clock select signal CSBN is latched into the latch of the write clock generator 13 of FIG. 6. If CSBN is low, then the voltage on node 90 is pulled to ground and is latched by cross-coupled inverters 91-92. If CSBN is high, then the voltage on node 90 remains in its previously latched state. As the waveform diagram of FIG. 7 shows, CSBN is low in the presently described operational example. A digital low is therefore latched into node 90, and a digital high is latched into node 93. The digital value on node 93 is the value of the write clock signal WCLK. The write clock signal WCLK therefore transitions high as illustrated in FIG. 7.

The address input latch of FIG. 4 includes a pair of latches 94 and 95 for latching the two read address bit values RADR[0] and RADR[1], respectively. Latches 94 and 95 are transparent when signal RCLK is low, and latch on the rising edge of RCLK. The value of RADR[0] is therefore latched onto node 96 in latch 94 on the rising edge of RCLK. The value of RADR[1] is therefore latched onto node 97 in latch 95 on the rising edge of RCLK.

At time T1 in the waveform diagram of FIG. 7, RCLK is low and has not yet transitioned high. Latch 94 is therefore transparent. RADR[O] is therefore present on node 96. Because RCLK is low, NAND gate 98 outputs a digital high. Gating circuit 99 therefore asserts both RCA0 and RCA0N high. Because RCA0 and RCA0N are high and are driving the P-channel transistors of the demultiplexers in the column multiplexer/demultiplexers of FIG. 3, the demultiplexers are disabled and the bit lines are not coupled to the input leads of the sense amplifiers of the column multiplexer/demultiplexers.

At time T1 in the waveform diagram of FIG. 7, RCLK is low and latch 95 is transparent. RADR[1] is therefore present on node 97. Because RWDCLK is a digital low as illustrated in FIG. 7, the latched value of RADR[1] on node 97 is supplied through multiplexer 100 onto node 101. Because ICLK is low, however, gating circuit 102 blocks the signal on node 101 from being output onto the word line output leads 103 and 104. Digital low signals are present on the word line output leads 103 and 104.

Because the access transistors of the memory cells of FIG. 4 are N-channel transistors, the low signals on WL0 and WL1 prevent any of the access transistors in the array 2 from being conductive.

The address input latch of FIG. 4 further includes a second pair of latches 105 and 106 for latching the two write address bit values WADR[0] and WADR[1], respectively. Latches 105 and 106 are transparent when signal WCLK is low, and latch on the rising edge of WCLK. The value of WADR[0] is therefore latched onto node 107 in latch 105 on the rising edge of WCLK. The value of WADR[1] is therefore latched onto node 108 in latch 106 on the rising edge of WCLK.

At time T1 in the waveform diagram of FIG. 7, WCLK is low and has not yet transitioned high. Latch 105 is therefore transparent. WADR[0] is therefore present on node 107. Because WCLK is low, NAND gate 109 outputs a digital high. Gating circuit 110 therefore forces both WCA0 and WCA0N low. Because WCA0 and WCA0N are low and are driving the N-channel transistors of the multiplexers in the column multiplexer/demultiplexers of FIG. 3, the demultiplexers are disabled and the bit lines are not coupled to the data input leads DIN[7:0] and DINN[7:0] of the column multiplexer/demultiplexers.

At time T1 in the waveform diagram of FIG. 7, WCLK is low and latch 106 is transparent. WADR[1] is therefore present on node 108. Because RWDCLK is a digital low as illustrated in FIG. 7, the value on node 108 is not supplied through multiplexer 100 onto node 101.

At time T1, ICLK is low. The transistors 36-41 in the column multiplexer/demultiplexers 3-10 are therefore conductive. The bit lines of each pair of bit lines are coupled together, and are coupled to supply voltage VCC. The bit lines are therefore said to be precharged.

Next, the externally supplied clock signal CLK transitions high. Before the transition of the signal CLK, the signal CLK was a digital low. CSAN was a digital low as indicated by the waveform of FIG. 7. NOR gate 109 of FIG. 6 therefore was supplying a digital high signal onto the gate of N-channel transistor 110. When CLK transitions high, a high signal is present on the gate of N-channel transistor 111. Both N-channel transistors 111 and 110 are therefore conductive for a short amount of time until the digital high CLK signal propagates through inverters 112 and 113 and NOR gate 109 to force the voltage on the gate of N-channel transistor 110 low. The voltage on node 86 is therefore pulled to ground momentarily through transistors 111 and 110. The voltage on node 86 is thereby latched to a digital low and the voltage on node 89 is latched to a digital high. This is illustrated in the waveform of FIG. 7 by the low-to-high transition of the signal RCLK.

The low-to-high transition of the signal CLK causes a digital low signal to be latched onto node 90 in the WCLK generator 13 of FIG. 6 by a similar process. N-channel transistors 114 and 115 are momentarily conductive. The result is a low-to-high transition of the signal WCLK on node 93. This is illustrated by the low-to-high transition of the signal WCLK in FIG. 7. The low-to-high transition of WCLK causes WADR[1:0] to be latched into latches 105 and 106 of the address input latch of FIG. 4.

When RCLK transitions high, latches 94 and 95 of FIG. 4 latch the read address values RADR[0] and RADR[1] onto nodes 96 and 97, respectively. Because RCLK is high and RWDCLK is low, NAND gate 98 outputs a digital low signal. Gating circuit 99 therefore does not force both RCA0 and RCA0N high as before. The latched RADR[0] value on node 96 is output as RCA0 and its complement is output as RCA0N. The read column address values are supplied to the column multiplexer/demultiplexers 3-10 in preparation for the upcoming read operation. This is represented in FIG. 7 by the waveform labeled COLUMN ADR TO COL MUX. As seen in FIG. 3, the read column addresses RCA0 and RCA0N cause multiplexer 23 to select one of the pairs of bit lines and to couple the selected pair to the input leads of sense amplifier 22.

When WCLK transitions high, the signal RWDCLK is a digital low. NAND gate 109 of FIG. 4 therefore continues to output a digital high, and gating circuit 110 continues to force both write column address values WCA0 and WCA0N low to their inactive states.

Returning to FIG. 6, the high-to-low transition on node 86 is supplied onto the lower input lead of NAND gate 116. NAND gate 116 therefore asserts the internal clock signal ICLK high. This is represented in FIG. 7 by the low-to-high transition of signal ICLK. When ICLK transitions high, the precharging of the bit lines of array 2 is stopped. Precharging transistors 36-41 of FIG. 3 become nonconductive in preparation for the upcoming read operation.

When ICLK transitions high, gating circuit 102 of FIG. 4 no longer forces digital logic level low signals onto both of the word lines. The latched read address value RADR[1] on node 97 is therefore output onto word line WL1 output lead 103. The complement of the read address value is output onto word line WL0 output lead 104. A digital high is therefore present on one of the word lines WL0 and WL1. This is represented in the waveform of FIG. 7 by the low-to-high transitioning of the waveform labeled WL (ONE OF WL0 and WL1). As seen in FIG. 2, the high value on a word line causes all the access transistors of all the memory cells of the associated row of sixteen memory cells to be conductive. One entire sixteen-bit value is output from the array 2 to the eight column multiplexer/demultiplexers. The eight column multiplexers 3-10 select one eight-bit value to be output onto the data output leads 117-124 of the memory based on the value of the read address values RCA0 and RCA0N. The differential voltages on selected pairs of bit lines are coupled through the multiplexers of the column multiplexer/demultiplexers, and onto the input leads of the sense amplifiers of the column multiplexer/demultiplexers. The resulting eight-bit value is output onto the output leads 117-124 of the memory device 1. The outputting of the eight-bit data value is illustrated in FIG. 7 at time T2 in the waveform labeled DOUT[7:0](READ).

Returning to FIG. 6, a one shot circuit 15 detects the low-to-high transition of the signal ICLK and outputs a high pulse of a RESET signal. This is illustrated in FIG. 7 by the first high pulse in the waveform labeled RESET. In F*igure* 7, the dashed arrow labeled A represents the delay introduced by one shot circuit 15.

RESET pulsing high causes RCLK to transition low because the high value of RESET is present on the upper input lead of NAND gate 126 of FIG. 6. RDWCLK is a digital low, so a digital high is also present on the lower input lead of NAND gate 126. NAND gate 126 therefore outputs a digital low signal, thereby causing P-channel transistor 127 to be made conductive. Node 86 is pulled high because node 86 is coupled to VCC through transistor 127. The signal RCLK on node 89 therefore transitions low. This is illustrated in FIG. 7 by the high-to-low transition of the RCLK waveform.

A digital high is present on the upper input lead of NAND gate 116 in FIG. 6. ICLK is therefore low. When the voltage on node 86 transitions high, a digital high signal is also present on the lower input lead of NAND gate 116. NAND gate 116 therefore outputs a digital low signal. This is illustrated in FIG. 7 by the high-to-low transition of the signal ICLK. The precharging transistors 36-41 in the column multiplexer/demultiplexers are therefore made conductive again to start a precharging operation for the upcoming write operation.

Before the data being output from the memory device can change due to the precharging, a sense signal SENS is supplied to the latches in the sense amplifiers in the column multiplexer/demultiplexers. The low-to-high transition of the signal SENS causes the latches in the column multiplexer/demultiplexers to latch and hold the data values on the output leads 117-124 of the memory device 1. A one shot circuit (not shown) generates the SENS signal and pulses the SENS signal high upon the falling edge of the signal ICLK when RWDCLK is low. The latching of the output data is considered the end of the read operation.

RCLK transitioning low when WCLK is a digital high causes a digital low signal to be present on both input leads of NOR gate 128. NOR gate 128 therefore outputs a digital high signal. This signal propagates through inverters 129 and 130. RWDCLK therefore transitions high as illustrated in FIG. 7 by the low-to-high transition in the waveform labeled RWDCLK.

Returning to FIG. 4, the low-to-high transition in the signal RWDCLK causes the write address values to be output from the address input latch of FIG. 4. RWDCLK being high causes a digital low to be present on the upper input lead of NAND gate 98. NAND gate 98 therefore outputs a digital high. This causes gating circuit 99 to force RCA0 and RCA0N to digital high values. Forcing both RCA0 and RCA0N high causes the multiplexer 23 in the column multiplexer/demultiplexers of FIG. 3 to couple no bit lines to the sense amplifiers.

Returning to FIG. 4, RWDCLK being high causes NAND gate 109 to output a digital high signal. Gating circuit 110 therefore no longer blocks the write address value WADR[0] latched in latch 105 from being output onto WCA0 and WCA0N. The write column address value WADR[0] is therefore communicated through gating circuit 110 to the demultiplexer 21 in the column multiplexer/demultiplexer of FIG. 3. The data input values on DIN[7:0] and DINN[7:0] are therefore communicated through the demultiplexers of the column multiplexer/demultiplexers onto a selected set of eight pairs of bit lines. The values of WCA0 and WCA0N determine which set of eight pairs is the selected set. In FIG. 3, the data values are communicated through the demultiplexer and up into the memory array 2 so that the data values can be written into the row of memory cells identified by word line address values WL0 and WL1.

Returning to FIG. 6, the low-to-high transition of RWDCLK continues to propagate through inverters 131 and 132 and onto the upper input lead of NAND gate 133. NAND gate 133 outputs a digital low signal, which is inverted by inverter 134. A digital high signal is therefore asserted onto the upper input lead of NAND gate 135. A digital high signal was already present on the lower input lead of NAND gate 135 due to the low value of the signal RESET causing NAND gate 136 of the WCLK generator circuit 13 to output a digital high signal. NAND gate 135 therefore outputs a digital low signal, thereby causing NAND gate 116 to assert ICLK high. This propagation delay from the rising edge of RWDCLK to the rising edge of ICLK is shown in FIG. 7 by the dashed arrow labeled B. The rising edge of the signal ICLK terminates the precharge of the write operation.

Returning to FIG. 4, the rising edge of ICLK is supplied to gating circuit 102. Gating circuit 102 therefore no longer forces both WL0 and WL1 to be low, but rather allows the write address value WADR[1] on node 101 to be output onto word line WL1 output lead 103. The write address value that was latched into node 108 is multiplexed onto node 101 due to the value of RWDCLK being a digital high during the write operation. The result is that the write address value WADR[1] is output onto WL1 output lead 103 and its complement is output onto WL0 output lead 104. This is illustrated in FIG. 7 by the transitioning in the waveform labeled WL (ONE OF WL0 AND WL1).

The write address values WADR[0] and WADR[1] are therefore used to address memory array 2 during the write operation. This is represented in FIG. 7 by the label WCA that appears in the waveform labeled COLUMN ADR TO COL MUX. Data in the eight addressed memory cells may switch at time T3 as illustrated in FIG. 7.

Returning to FIG. 6, the low-to-high transitioning of ICLK is again detected by one shot circuit 15. After a delay represented in FIG. 7 by the dashed arrow labeled C, one shot circuit 15 outputs a high pulse of the signal RESET. The high pulse of the signal RESET is asserted onto the upper input lead of NAND gate 136. Because RWDCLK is high, there are digital high signals on both input leads of NAND gate 136. NAND gate 136 drives a digital low signal onto the gate of P-channel transistor 137, thereby latching a digital high signal onto node 90 in the WCLK generator circuit 13. Signal WCLK on node 93 therefore transitions low. This is illustrated in FIG. 7 by the high-to-low transition of the waveform WCLK.

WCLK transitioning low causes NAND gate 133 to output a digital high. Inverter 134 outputs a digital low thereby causing NAND gate 135 to output a digital high. Because RCLK is a digital low, the voltage on node 86 in the RCLK generator circuit 12 is a digital high. There are digital high signals on both input leads of NAND gate 116, thereby causing NAND gate 226 to assert ICLK low. This is illustrated in FIG. 7 by the second high-to-low transition of the signal ICLK.

WCLK transitioning low also causes a digital high signal to be present on the lower input lead of NOR gate 128 of FIG. 6. NOR gate 128 outputs a digital low signal that propagates through inverters 129 and 130, thereby causing RWDCLK to transition low. This is illustrated in FIG. 7 by the high-to-low transition in the waveform labeled RWDCLK. At this point, the bit lines of memory array 2 area being precharged in preparation for a subsequent memory access operation.

Pseudo-dual port memory device 1 therefore performs a read operation followed by a write operation within a single cycle of the external clock signal CLK. The rising edge of the external signal CLK is used to initiate the read operation, but unlike the conventional pseudo-dual port memory described in the background section the falling edge of no externally generated clock signal is used to initiate the beginning of the write operation. Rather, asynchronous propagation delays through logic circuitry and one shots are used to time the control signals necessary to carry out the first read operation, to precharge the bit lines of the memory and perform the second write operation.

Figure 8:
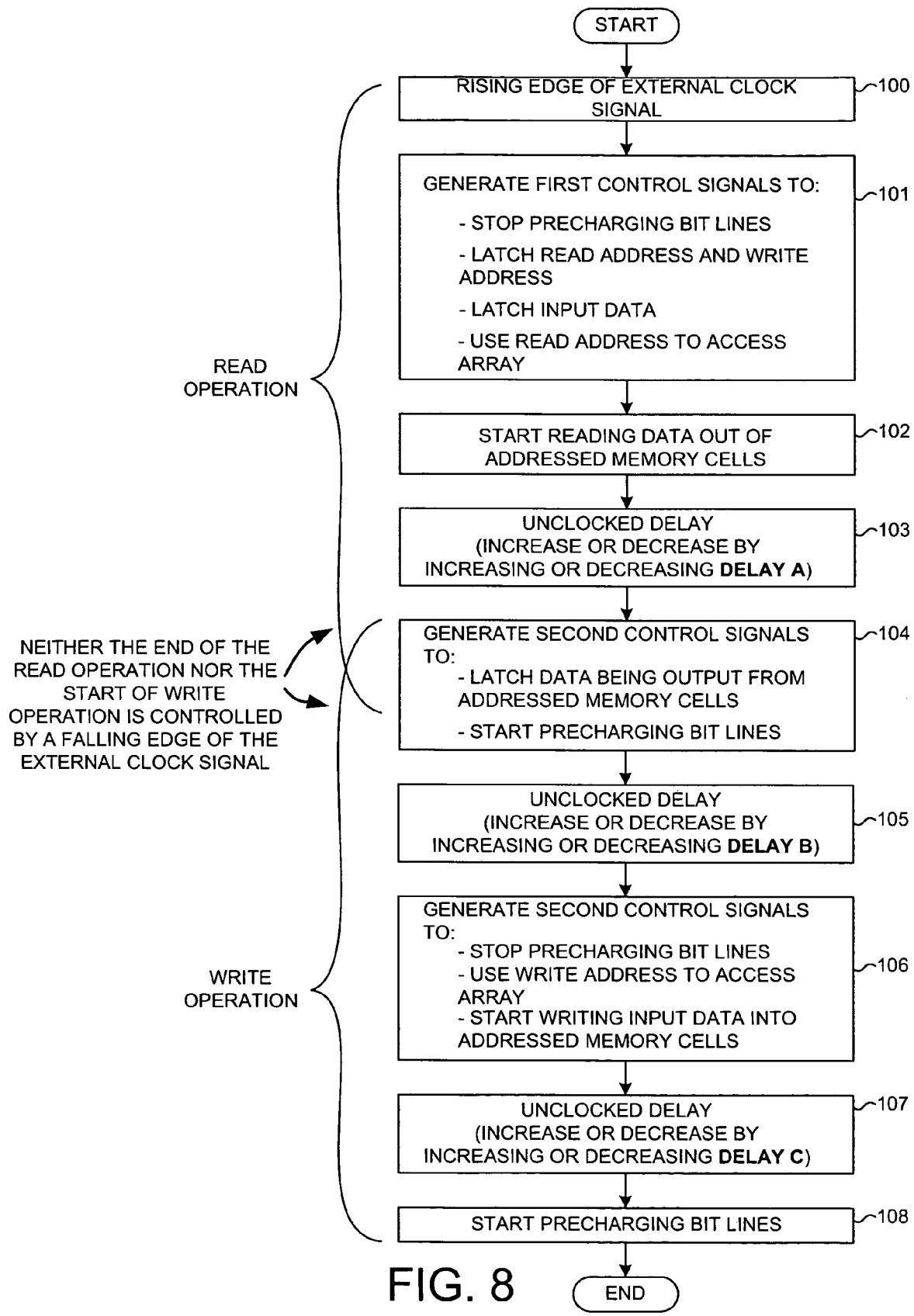
FIG. 8 is a flowchart that sets forth a method carried out by the pseudo-dual port memory device 1 of FIGS. 1-6.

FIG. 8 is a flowchart that sets forth a method carried out by the pseudo-dual port memory device of FIGS. 1-6. The rising edge of the external clock signal CLK at time T1 (step 100) initiates the generation of first control signals. These first control signals: cause the precharging of the bit lines of array 2 to stop; cause the read address value RADR[1:0] and the write address value WADR[1:0] to be latched into the address input latch 11 of FIG. 4; cause the input data DATAIN[7:0] to be latched into the data input latch of FIG. 5; and cause the read address value RADR[1:0] to be used to access the memory array 2. The readout of eight selected memory cells is initiated (step 102). After an amount of time (step 103) determined in part by the delay A of one shot circuit 15, the data DOUT[7:0] read out from the array 2 by time T2 is latched (step 104) into the sense amplifiers in the column multiplexer/demultiplexers 3-10. The read operation is considered terminated when the output data is latched (step 104).

Second control signals are generated for performing a memory write operation. The precharging of the bit lines of memory array 2 is initiated in preparation for a write memory access. This precharging state is maintained for an amount of time (step 105) determined in part by propagation delay B. The second control signals then: cause the precharging of the bit lines to stop; cause the write address WADR[1:0] to be used to access the memory array 2; and cause the writing of input data DATAIN[7:0] into the accessed memory cells to be started (step 106). By time T3 the input data has been written into the accessed cells. After an amount of time (step 107) determined in part by the delay C of one shot circuit 15, the writing to the accessed memory cells is stopped and the bit lines of the memory array are again precharged (step 108). The write operation is considered to include the precharge period immediately preceding the write memory access.

The amounts of time of delay A, delay B, and delay C can be increased or decreased during the design of a memory device in order to change the relative proportion of the total period of the signal CLK that is allotted for the read operation versus the write operation. The end of the first memory operation can overlap the beginning of the second memory operation in time. In some implementations of a memory device, the read operation may be allotted more time than the write operation. In other implementations, the write operation may be allotted more time than the read operation. Problems associated with initiating the write operation using the falling edge of an external clock signal where the falling edge has an undesirably large amount of jitter are avoided because the falling edge of an externally supplied clock signal is not used to terminate the first read operation or to initiate the second write operation.

Although certain specific embodiments are described above for instructional purposes, the present invention is not limited thereto. The control circuitry of the pseudo-dual port memory can be used in embodiments where the first memory access operation is a write operation and the second memory access operation is a read operation, where the first memory access operation is a write operation and the second memory access operation is a write operation, and where the first memory access operation is a read operation and the second memory access operation is a read operation. Accordingly, various modifications, adaptations, and combinations of the various features of the described specific embodiments can be practiced without departing from the scope of the invention as set forth in the claims.

What is claimed is:

1. A method comprising:
   (a) receiving a clock signal, a first address value and a second address value into a pseudo-dual port memory device;
   (b) using a first transition of the clock signal to latch the first address value and the second address value into the pseudo-dual port memory device;
   (c) generating first control signals for performing a first memory access operation of the pseudo-dual port memory device and performing the first memory access operation such that first memory cells addressed by the first address value are accessed; and
   (d) generating second control signals for performing a second memory access operation of the pseudo-dual port memory device and performing the second memory access operation such that second memory cells addressed by the second address value are accessed, wherein both the first memory access operation and the second memory access operation are performed in a single period of the clock signal, and wherein no second transition of the clock signal is used to initiate the second memory access operation.

2. The method of claim 1, wherein the first memory access operation is a read operation and wherein the second memory access operation is a write operation.

3. The method of claim 1, wherein the first transition is a rising edge of the single period of the clock signal, and wherein no falling edge of the single period of the clock signal is used to initiate the second memory access operation.

4. The method of claim 1, wherein the first memory access operation includes an amount of time that the first memory cells are addressed and are being accessed, the amount of time being dependent upon at least a delay time of a one shot circuit, wherein the one shot circuit is triggered by assertion of one of the first control signals, and wherein the one shot circuit outputs a pulse that causes the first memory access operation to be terminated.

5. The method of claim 1, wherein the second memory access operation includes a first amount of time when bit lines coupled to the second memory cells are being precharged and further includes a second amount of time when the second memory cells are addressed and are being accessed, wherein the first amount of time is dependent upon at least a propagation delay through a chain of digital logic gates, and wherein the second amount of time is dependent upon at least a delay time of a one shot circuit, wherein the one shot circuit is triggered by assertion of one of the second control signals, and wherein the one shot outputs a pulse that causes the second memory access operation to be terminated.

6. The method of claim 1, wherein the clock signal has a duty cycle, wherein the first memory access operation takes a first amount of time, wherein the second memory access operation takes a second amount of time, and wherein the ratio of the first amount of time to the second amount of time is independent of the duty cycle of the clock signal.

7. The method of claim 1, wherein the first edge of the clock signal causes a rising edge of a read clock signal, wherein the read clock signal causes the latching of the first address value in (b), and wherein the first edge of the clock signal also causes a rising edge of a write clock signal, and wherein the write clock signal causes the latching of the second address value in (b).

8. The method of claim 1, wherein the pseudo-dual port memory device includes a plurality of word lines and a plurality of column multiplexers,
wherein the generating first control signals includes driving a read word address value onto the word lines, and wherein the generating first control signals further includes supplying a read column address value to the column multiplexers, and
wherein the generating second control signals includes driving a write word address value onto the word lines, and wherein the generating second control signals further includes supplying a write column address value to the column multiplexers.

9. A pseudo-dual port memory that receives an external clock signal CLK and performs a read cycle and a write cycle during a single period of the signal CLK, the pseudo-dual port memory comprising:
a memory array having a plurality of word lines and a plurality of bit lines;
a read clock generator that receives the signal CLK and outputs a read clock signal RCLK;
a write clock generator that receives the signal CLK and outputs a write clock signal WCLK;
a time delayed multiplexer that receives the read clock signal RCLK and the write clock signal WCLK and that outputs a first ICLK pulse during the read cycle and that outputs a second ICLK pulse during the write cycle, the time delayed multiplexer also outputting a decoding signal RWDCLK that has one digital value during the read cycle and has a second digital value during the write cycle;
an address input latch circuit that outputs a read column address value during the read cycle when the read clock signal RCLK is being output by the read clock generator, the address input latch circuit also outputting a write column address value during the write cycle when the write clock signal WCLK is being output by the write clock generator, the address input latch circuit also outputting a read word line address value onto the word lines of the memory array, where the read word line address value is output during the first ICLK pulse when the decoding signal RWDCLK has said one digital value, the address input latch circuit also outputting a write word line address value onto the word lines of the memory array, where the write word line address value is output during the second ICLK pulse when the decoding signal RWDCLK has said second digital value;
a plurality of column multiplexer/demultiplexers coupled to the plurality of bit lines, where each column multiplexer/demultiplexer is coupled to receive the read column address value from the address input latch circuit, and where each column multiplexer/demultiplexer is coupled to receive the write column address value from the address input latch circuit; and
a delay circuit that receives the first ICLK pulse and the second ICLK pulse from the time delayed multiplexer and sends a first reset signal to the read clock generator an amount of time after the beginning of the first ICLK pulse, where the first reset signal causes the read clock generator to stop outputting the read clock signal RCLK, the delay circuit also sending a second reset signal to the write clock generator the amount of time after the beginning of the second ICLK pulse, where the second reset signal causes the write clock generator to stop outputting the write clock signal WCLK.

10. The pseudo-dual port memory of claim 9, wherein the time delayed multiplexer includes no clocked sequential logic elements.

11. The pseudo-dual port memory of claim 9, wherein the delay circuit is a one shot circuit that is triggered a first time by an edge of the first ICLK pulse and that is triggered a second time by an edge of the second ICLK pulse.

12. The pseudo-dual port memory of claim 9, wherein the external clock signal CLK has a duty cycle, wherein the read cycle has a duration, wherein the write cycle has a duration, and wherein a ratio of the duration of the read cycle to the duration of the write cycle is independent of the duty cycle of the external clock signal CLK.

13. The pseudo-dual port memory of claim 9, wherein the pseudo-dual port memory receives an externally supplied read address value, an externally supplied write address value, and an externally supplied data value, and wherein the address input latch circuit latches the externally supplied read address value, the externally supplied write address value and the externally supplied data value on an edge of the external clock signal CLK.

14. A pseudo-dual port memory that receives an externally supplied clock signal CLK and performs a first memory access operation and a second memory access operation during a single period of the signal CLK, the externally supplied clock signal CLK having a duty cycle, the pseudo-dual port memory comprising:
an array of memory cells; and
means for (A) generating first control signals and supplying the first control signals to the array of memory cells such that the first memory access operation is performed during a first portion of said single period and (B) generating second control signals and supplying the second control signals to the array of memory cells such that the second memory access operation is performed during a second portion of said single period, wherein the beginning of the second portion is independent of the duty cycle of the externally supplied clock signal CLK.

15. The pseudo-dual port memory of claim 14, wherein the means includes a delay circuit, the delay circuit generating a pulse that causes the first memory access operation to be terminated.

16. The pseudo-dual port memory of claim 15, wherein a precharge period follows the termination of the first memory access operation, the precharge period having a duration, wherein the duration of the precharge period is not dependent upon the duty cycle of the signal CLK but rather is dependent upon a propagation delay through the means.

17. The pseudo-dual port memory of claim 16, wherein a memory access occurs following the precharge period, the memory access having a duration and occurring during the single period of the signal CLK, wherein the duration of the memory access is not dependent upon the duty cycle of the signal CLK but rather is dependent upon a delay through the delay circuit, wherein the delay circuit generates a second pulse that causes the second memory access operation to be terminated.

18. The pseudo-dual port memory of claim 14, wherein the means comprises:
a read clock generator that uses the externally supplied clock signal CLK to latch a read address value, the read clock generator outputting a read clock signal;
a write clock generator that uses the externally supplied clock signal CLK to latch a write address value, the write clock generator outputting a write clock signal; and
a time delayed multiplexer that receives the read clock signal and the write clock signal and outputs a clock signal ICLK, wherein the clock signal ICLK pulses twice during the single period of the externally supplied clock signal CLK, the clock signal ICLK controlling when bit lines of the array are precharged.

19. The pseudo-dual port memory of claim 18, wherein the means further comprises:
a delay circuit that is triggered by an edge of a first pulse of the clock signal ICLK and in response thereto generates a first reset pulse, the first reset pulse causing the read clock generator to stop outputting the read clock signal, the delay circuit being triggered by an edge of a second pulse of the clock signal ICLK and in response thereto generating a second reset pulse, the second reset pulse causing the write clock generator to stop outputting the write clock signal.

20. A method of operating a pseudo-dual port memory device, said method comprising:
(a) receiving a clock signal, a first address value and a second address value into the memory device;
(b) using a first transition of the clock signal to latch the first address value and the second address value into the memory device;
(c) over a first portion of a period of the clock signal, performing a first memory access operation such that memory cells of the memory device that are addressed by the first address value are accessed; and
(d) over a second portion of the period of the clock signal, performing a second memory access operation such that memory cells of the memory device that are addressed by the second address value are accessed,
wherein the ratio of the duration of the first portion to the duration of the second portion is independent of the duty cycle of the clock signal.

21. The method of operating a pseudo-dual port memory device according to claim 20, wherein said method includes, in response to the first transition of the clock signal, generating a signal transition that initiates the second memory access operation.

22. The method of operating a pseudo-dual port memory device according to claim 20, wherein said method includes, in response to the first transition of the clock signal, generating a signal transition that initiates a write precharge operation.

* * * * *